(12) United States Patent
Cheng et al.

(10) Patent No.: US 9,218,995 B2
(45) Date of Patent: Dec. 22, 2015

(54) TRANSFER APPARATUS FOR TRANSFERRING ELECTRONIC DEVICES AND CHANGING THEIR ORIENTATIONS

(71) Applicants: Chi Wah Cheng, Tsing Yi (HK); Kai Fung Lau, North Point (HK); Hing Suen Siu, Kwai Chung (HK)

(72) Inventors: Chi Wah Cheng, Tsing Yi (HK); Kai Fung Lau, North Point (HK); Hing Suen Siu, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 1 day.

(21) Appl. No.: 14/258,463

(22) Filed: Apr. 22, 2014

(65) Prior Publication Data

US 2014/0328652 A1    Nov. 6, 2014

Related U.S. Application Data

(60) Provisional application No. 61/819,911, filed on May 6, 2013.

(51) Int. Cl.
*B65G 47/84* (2006.01)
*H01L 21/677* (2006.01)
*H01L 21/67* (2006.01)

(52) U.S. Cl.
CPC .... *H01L 21/67718* (2013.01); *H01L 21/67132* (2013.01)

(58) Field of Classification Search
USPC ............... 414/222.1, 223.01, 751.1, 223.02; 198/465.4, 469.1, 470.1, 803.3, 465.2, 198/465.3, 339.1
See application file for complete search history.

(56) References Cited

U.S. PATENT DOCUMENTS

| | | | | | |
|---|---|---|---|---|---|
| 4,064,016 | A | * | 12/1977 | Vortmann | 198/412 |
| 5,305,867 | A | * | 4/1994 | Leaton | 198/377.06 |
| 5,520,501 | A | * | 5/1996 | Kouno et al. | 414/741 |
| 8,002,106 | B2 | * | 8/2011 | Preti et al. | 198/459.2 |
| 2002/0184755 | A1 | * | 12/2002 | Suhara | 29/833 |
| 2010/0108473 | A1 | * | 5/2010 | Soncini | 198/803.3 |
| 2013/0284561 | A1 | * | 10/2013 | Santi | 198/417 |
| 2013/0313081 | A1 | * | 11/2013 | Krulitsch et al. | 198/803.3 |
| 2014/0102850 | A1 | * | 4/2014 | Cheng et al. | 198/339.1 |
| 2014/0202831 | A1 | * | 7/2014 | Varhaniovsky | 198/465.2 |
| 2014/0346154 | A1 | * | 11/2014 | Blei et al. | 219/121.72 |
| 2015/0121104 | A1 | * | 4/2015 | Kinouchi | 713/322 |

* cited by examiner

*Primary Examiner* — Paul T Chin
(74) *Attorney, Agent, or Firm* — Ostrolenk Faber LLP

(57) ABSTRACT

A transfer apparatus for transferring electronic devices from a wafer to a test handler. The transfer apparatus comprises: i) a rotary device rotatable about an axis; and ii) a plurality of holders configured to hold the electronic devices for transfer from the wafer to the test handler. The plurality of holders are coupled to, and extendable from, the rotary device to pick the electronic devices from the wafer. Specifically, the plurality of holders are arranged circumferentially around, and inclined with respect to, the axis of the rotary device, so as to change an orientation of the electronic devices on the wafer to a desired orientation of the electronic devices on the test handler.

15 Claims, 5 Drawing Sheets

TRANSFER APPARATUS FOR TRANSFERRING ELECTRONIC DEVICES AND CHANGING THEIR ORIENTATIONS

FIELD OF THIS INVENTION

This invention relates to a transfer apparatus for transferring and changing orientations of objects and may be used, particularly but not exclusively, for transferring and changing the orientations of integrated circuit packages.

BACKGROUND OF THE INVENTION

Singulated semiconductor packages mounted on a receiving surface, such as an adhesive tape, are typically oriented in such a way that their leads (or electrical contact points) face away from the receiving surface. After the semiconductor packages have been picked up by a transfer apparatus from the receiving surface, they may be required to be flipped by using an additional flipping mechanism before the semiconductor packages are transferred for subsequent processes, such as function testing or visual integrity checking. One drawback with using the flipping mechanism is that it increases the frequency by which the semiconductor packages are picked and placed, which invariably increases the likelihood of the packages dropping and/or damage.

Thus, it is an object of this invention to ameliorate the aforesaid drawback of the additional flipping mechanism, and to provide the general public with a useful choice.

BRIEF DESCRIPTION OF THE DRAWINGS

A preferred embodiment of the invention will now be described, by way of example only, with reference to the accompanying drawings, of which:

FIG. 1a shows a transfer apparatus, according to the preferred embodiment of the invention, arranged between a wafer and a test handler, while FIG. 1b is a plan view of the transfer apparatus as illustrated in FIG. 1a;

DETAILED DESCRIPTION OF THE PREFERRED EMBODIMENT

Figure 1A:
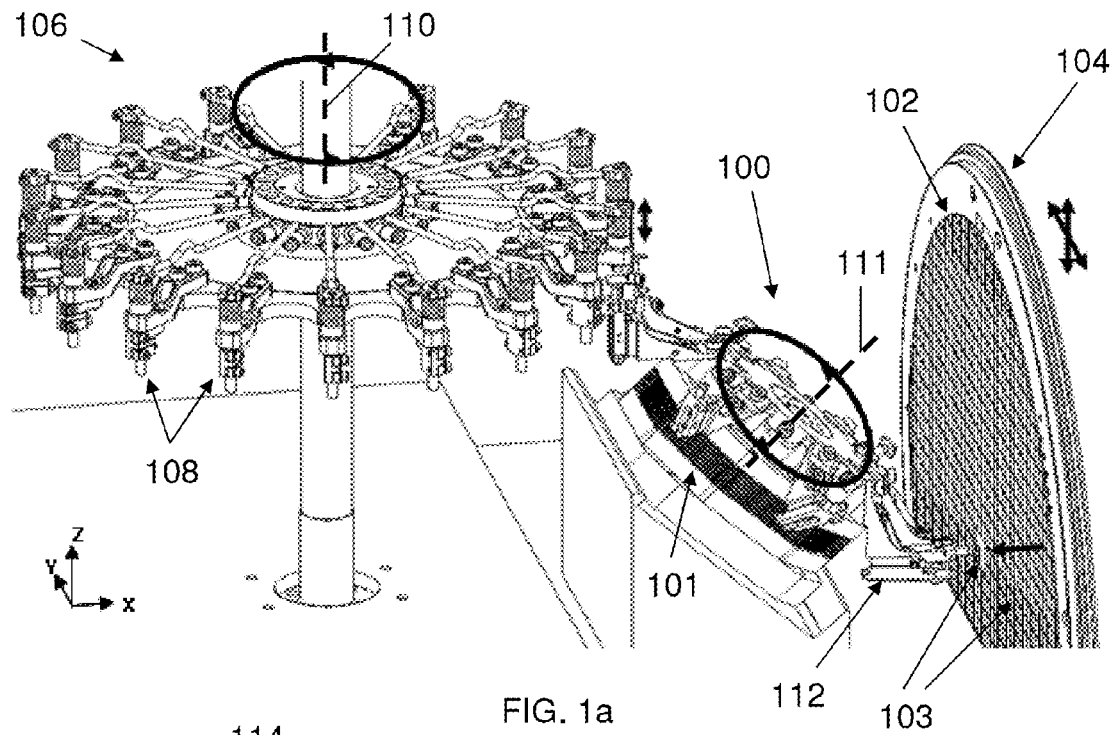

FIG. 1a shows a transfer apparatus 100 arranged between an array of electronic devices that has been manufactured on a receiving surface 102 of a wafer 102 that is placed on a wafer table 104, and a test handler (shown by a rotary turret 106) which is rotatable about a turret axis 110. The receiving surface 102 of the wafer 102 comprises a plurality of electronic devices (shown as integrated circuit packages 103) which are to be transferred by the transfer apparatus 100 to the rotary turret 106. The rotary turret 106 comprises a plurality of turret pick heads 108, which are circumferentially arranged around the turret axis 110, for picking the integrated circuit ("IC") packages 103 from the transfer apparatus 100 using suction force (eg vacuum suction force).

Likewise, the transfer apparatus 100 comprises a rotary device 101—which is rotatable about a transfer apparatus axis 111—and a plurality of holders (shown as transfer pick heads 112) which are coupled to and extendable from the rotary device 101. The rotary device 101 is tilted at an angle with respect to the turret axis 110 of the rotary turret 106. Specifically, the rotary device 101 is titled at an angle of 45 degrees with respect to the turret axis 110. In addition, the transfer pick heads 112 are circumferentially arranged around the transfer apparatus axis 111 to hold the IC packages 103 during transfer from a receiving surface of the wafer 102 to the rotary turret 106 using suction force (eg vacuum suction force). In particular, FIG. 1a shows that the transfer pick heads 112 are inclined at an angle with respect to the transfer apparatus axis 111. Such a configuration allows the transfer apparatus 100 to change an orientation of the IC packages 103 from the receiving surface on the wafer 102 to a desired orientation before the IC packages 103 are transferred to the rotary turret 106. More specifically, the transfer pick heads 112 are inclined at an angle of 45 degrees with respect to the transfer apparatus axis 111.

Consequently, the transfer apparatus 100 is configured to re-orientate the IC packages 103 by an angle of 90 degrees as they are transferred from the wafer 102 to the rotary turret 106. In other words, the vertical orientation of IC packages 103 on the receiving surface of the wafer 102 (whereby the leads face the transfer pick heads 112) will be re-orientated to an upside-down orientation (whereby the leads face downwards) after the IC packages 103 have been transferred by the transfer apparatus 100 from the wafer 102 to the rotary turret 106. Thus, the transfer apparatus 100 can change the orientation of the IC packages 103 without involving an additional and separate flipping mechanism.

Figure 1B:
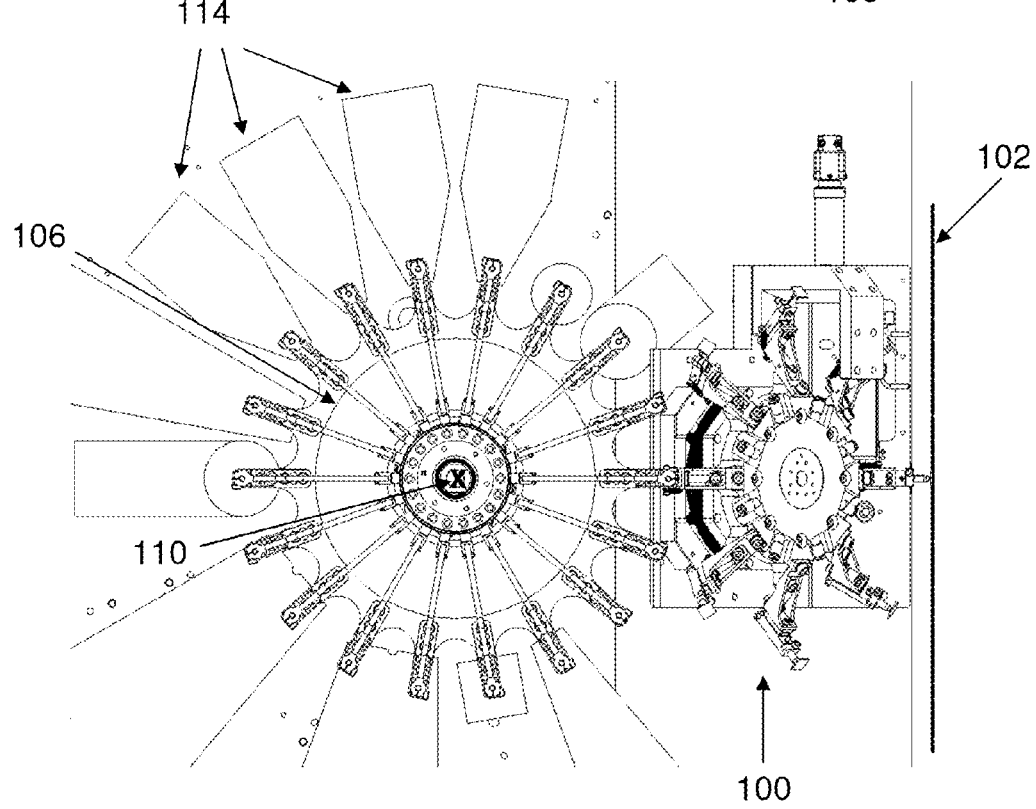

A plan view of the arrangement of the transfer apparatus 100, together with the wafer 102 and the rotary turret 106, is shown in FIG. 1b. It can be seen that the rotary turret 106 rotates about the turret axis 110 to index the received IC packages 103 to successive stations 114 for subsequent downstream processes, such as testing (eg visual inspection) and/or packing. It should be appreciated that besides the use of vacuum suction force, the turret pick heads 108a and the transfer pick heads 112 may also employ other means of holding the IC packages 103. One example is a mechanical gripper that is configured to grip the IC package 103.

Figure 2:
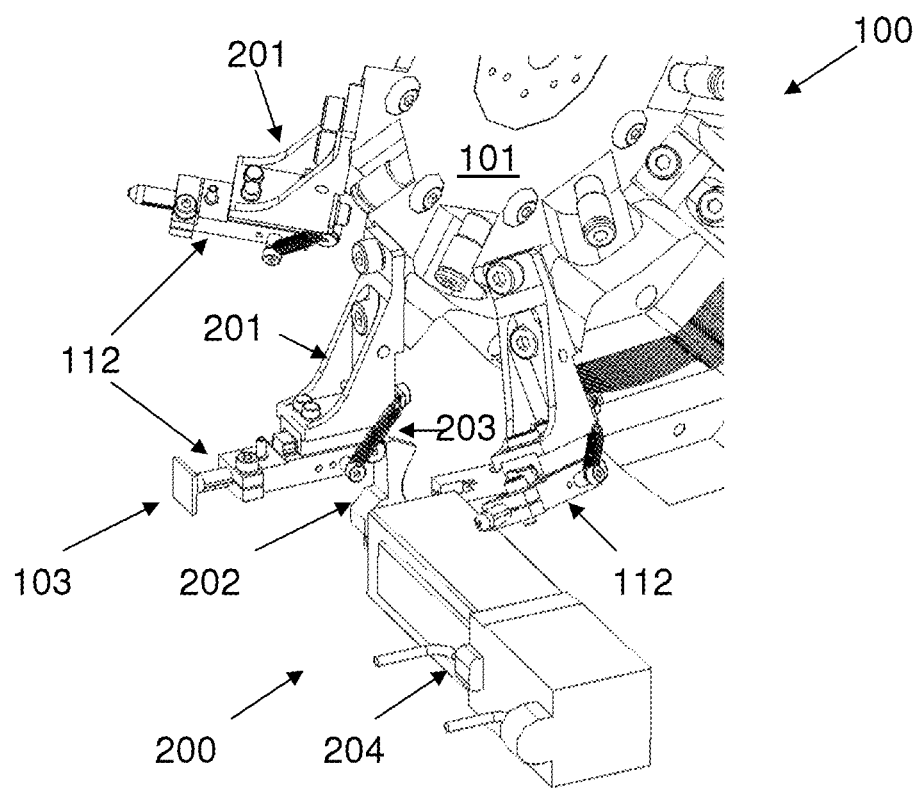
FIG. 2 is a close-up view of the transfer pick heads of the transfer apparatus, and shows a pick head pusher for extending each of the pick heads.

FIG. 2 is a close-up view of the transfer pick heads 112 of the transfer apparatus 100, and shows a device pusher in the form of a pick head pusher 200 for extending each of the pick heads 112. First, it can be seen that each of the transfer pick heads 112 are coupled to the rotary device 101 of the transfer apparatus 100 via an intermediate pick arm 201, which is located between the respective transfer pick head 112 and the rotary device 101. It can also be seen that a biasing device (shown as a spring 203) is arranged between each of the transfer pick heads 112 and the pick arm 201, in order to bias the pick head 112 towards a default retracted position.

Furthermore, the transfer apparatus 100 comprises the pick head pusher 200, comprising a kicker 202 and a motor 204 for driving the kicker 202 to extend each of the pick heads 112 from the default retracted position during pickup of the IC packages 103 from the wafer 102. Specifically, when driven by the motor 204, the kicker 202 abuts against the back of the pick head 112 to overcome the biasing force of the spring 203. This thereby extends the pick head 112 from the rotary device 101 to pick up an IC package 103 from the wafer 102 using vacuum suction force. When the motor 204 is driven to rotate in an opposite direction, the kicker 202 accordingly rotates in the opposite direction and the pick head 112 is thereby biased by the spring 203 to return to its original default position.

Figure 3:
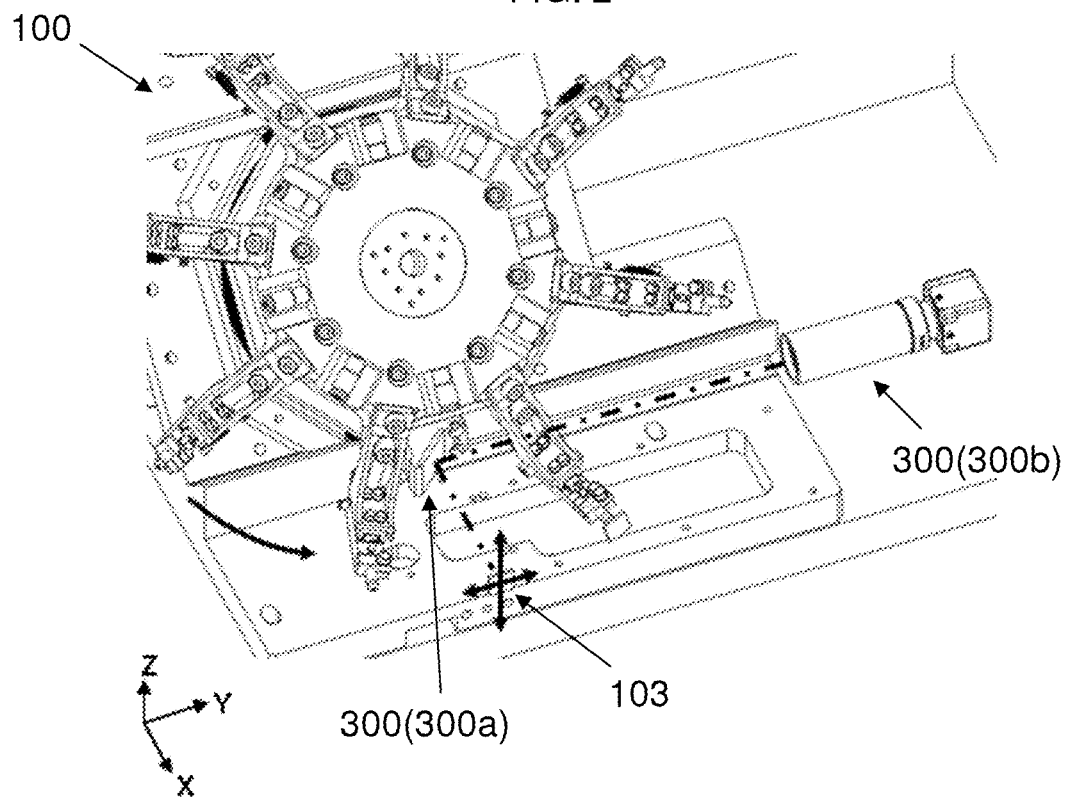
FIG. 3 shows a device detection device, comprising a mirror and a camera, of the transfer apparatus.

FIG. 3 shows a device detection device 300 of the transfer apparatus 100 for detecting a position of one or more of the IC package 103 on the wafer 102 before pick-up. The device detection device 300 comprises: i) an image-capturing device (shown as a camera 300b); and ii) an image-reflecting device (shown as a mirror 300a) for reflecting an image of the or each IC package 103 arranged on the wafer 102. Specifically, the mirror 300a reflects an image of the IC package 103 to the camera 300b, which transmits the captured image to a computer processor (not shown) for image analysis to ascertain a position of a next IC package 103 and whether the IC package 103 to be picked up by the pick head 112 has been properly aligned. If so, the computer processor transmits a signal instruction to the transfer apparatus 100 to proceed with the pick up. Otherwise, the computer processor transmits a signal instruction to the wafer table 104 for repositioning so that the pick head 112 is properly aligned for pick-up.

FIGS. 4a to 4g show a sequence of steps involved during an operation of the transfer apparatus 100 to transfer the IC packages 103 from the wafer 102 to the rotary turret 106.

Figure 4A:
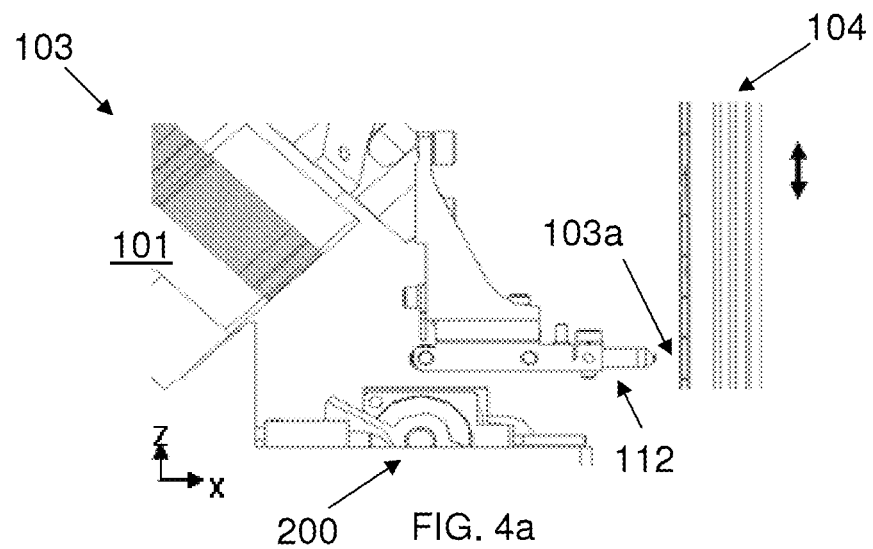
FIGS. 4a to 4g show the steps involved during an operation of the transfer apparatus.
Figure 4B:
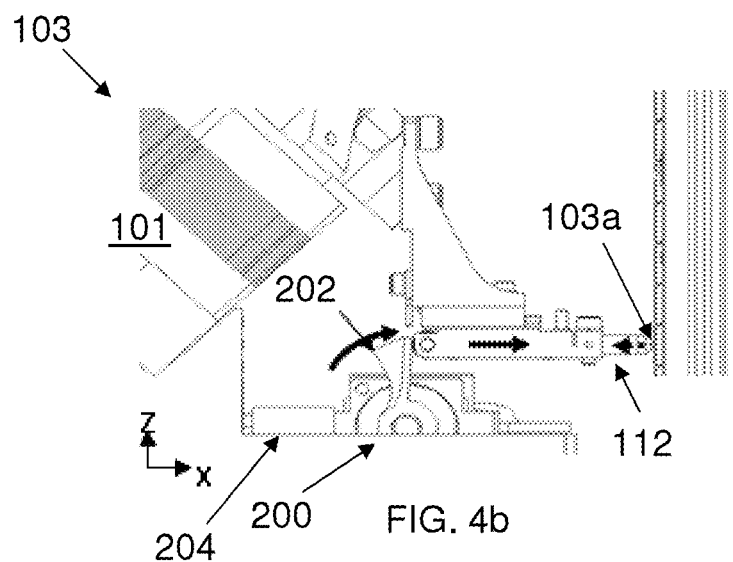

The step of positioning the wafer table 104 is first performed, as shown in FIG. 4a, so that a first IC package 103a to be transferred lies adjacent to the pick head 112 of the transfer apparatus 100 for pick up. This involves the operation of the device detection device 300, as described above. Thereafter, the step of activating the pick head pusher 200 to extend the pick head 112 from the rotary device 101 is performed, as shown in FIG. 4b. In particular, the kicker 202 is driven by the motor 204 to overcome the biasing force of the spring 203 (see FIG. 2) to extend the pick head 112 from its default retracted position for pick-up of the first IC package 103a from the wafer 102.

Figure 4C:
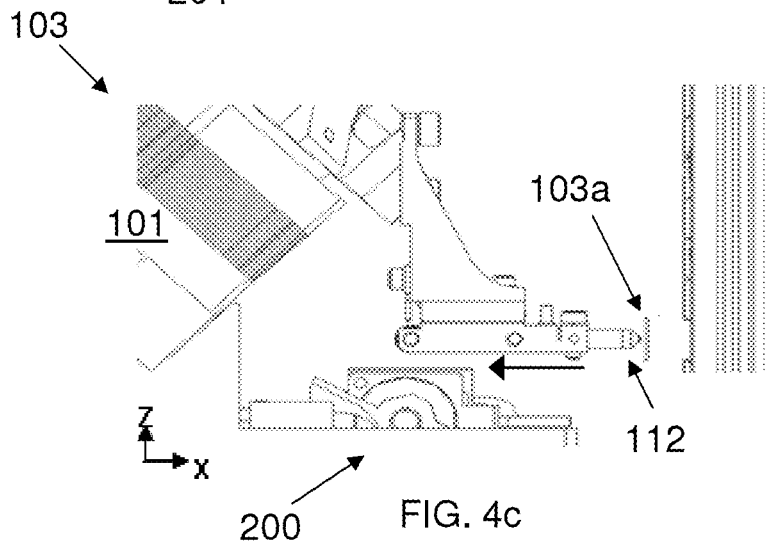

The step of driving the motor 204 in an opposite direction is then performed after the first IC package 103a has been picked up by the pick head 112, so that the kicker 202 rotates in the corresponding opposite direction. Accordingly, the biasing force of the spring 203 pulls the pick head 112 back to its original default position, as shown in FIG. 4c. The rotary device 101 is then indexed so that successive pick heads 112 of the transfer apparatus 100 can pick up respective other IC packages 103 from the wafer 102 in the same manner as described above.

Figure 4D:
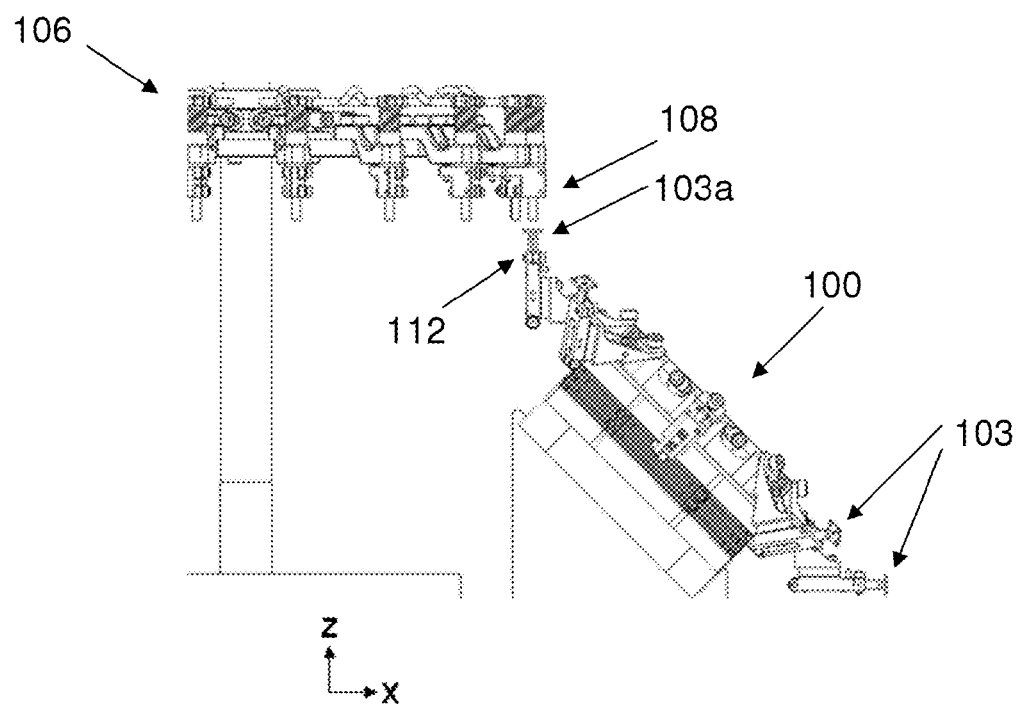
Figure 4E:
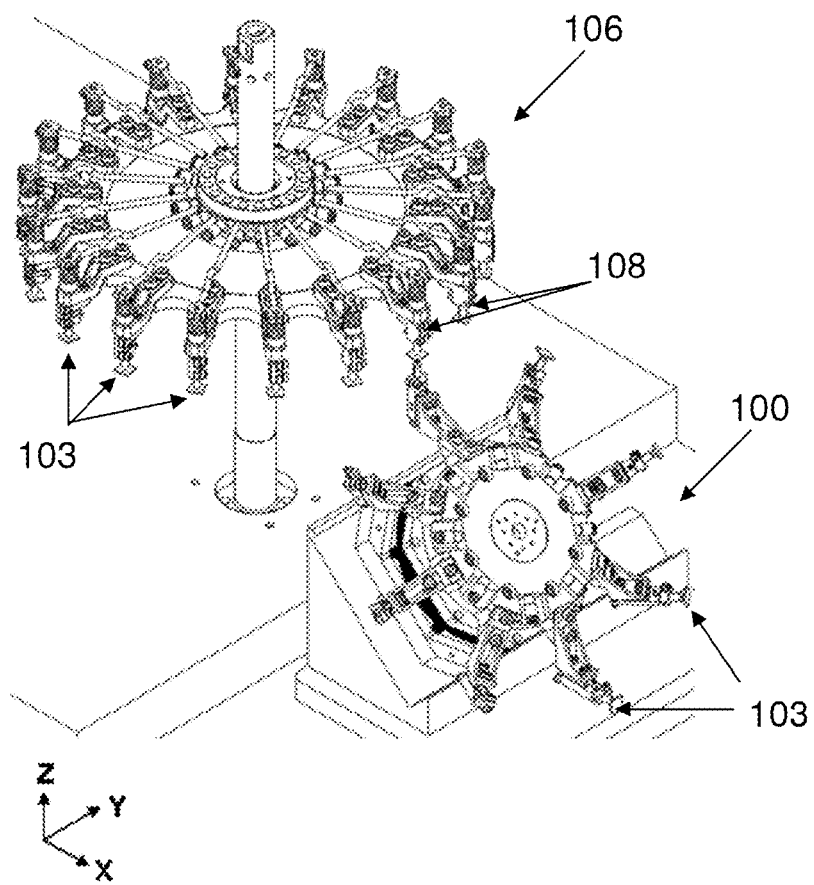
Figure 4F:
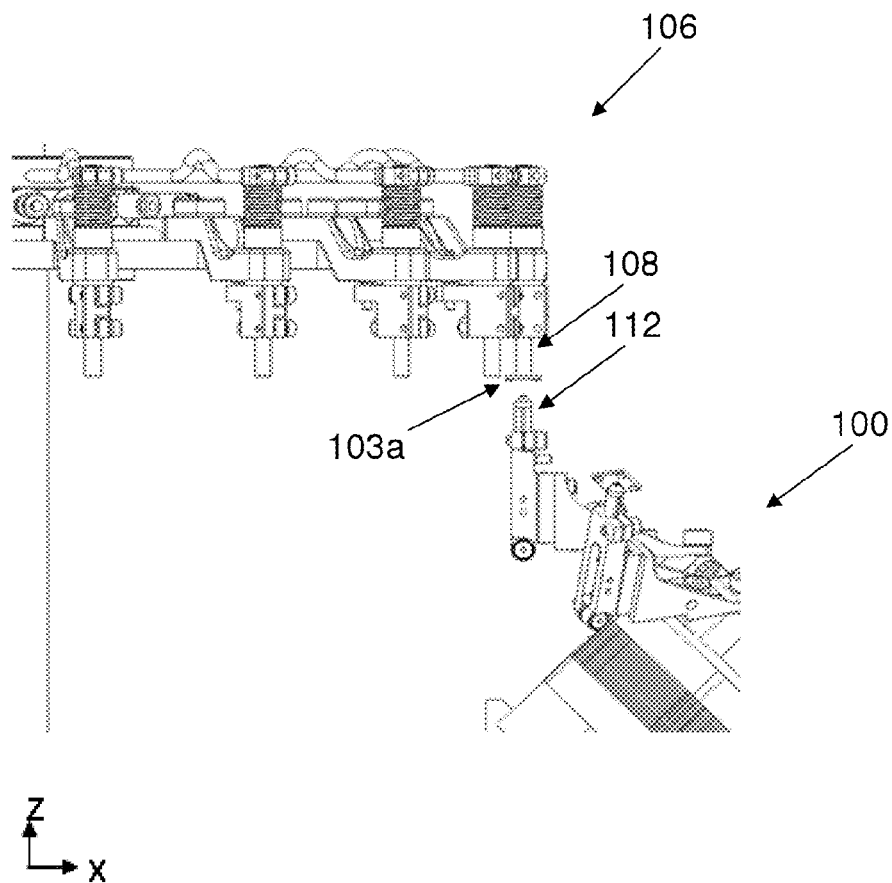

After the rotary device is rotated through four indexing positions, the first IC package 103a will have moved across half of a circumference path along which the pick heads 112 are arranged. The first IC package 103a will be positioned under one of the turret pick heads 108 of the rotary turret 106, as shown in FIG. 4d. While the transfer apparatus 100 and the rotary turret 106 remains in position, the step of extending the corresponding turret pick head 108 is performed to pick up the first IC package 103a from the pick head 112. This is shown in FIG. 4e. As the turret pick head 108 holds the first IC package 103a, the turret pick head 108 retracts back to its original default position as shown in FIG. 4f. It should, of course, be appreciated that the rotary device 101 may rotate through any number of indexing positions—depending on the number of pick heads 112—to transfer the first IC package 103a across half of a circumferential path along which the pick heads 112 are arranged.

Figure 4G:
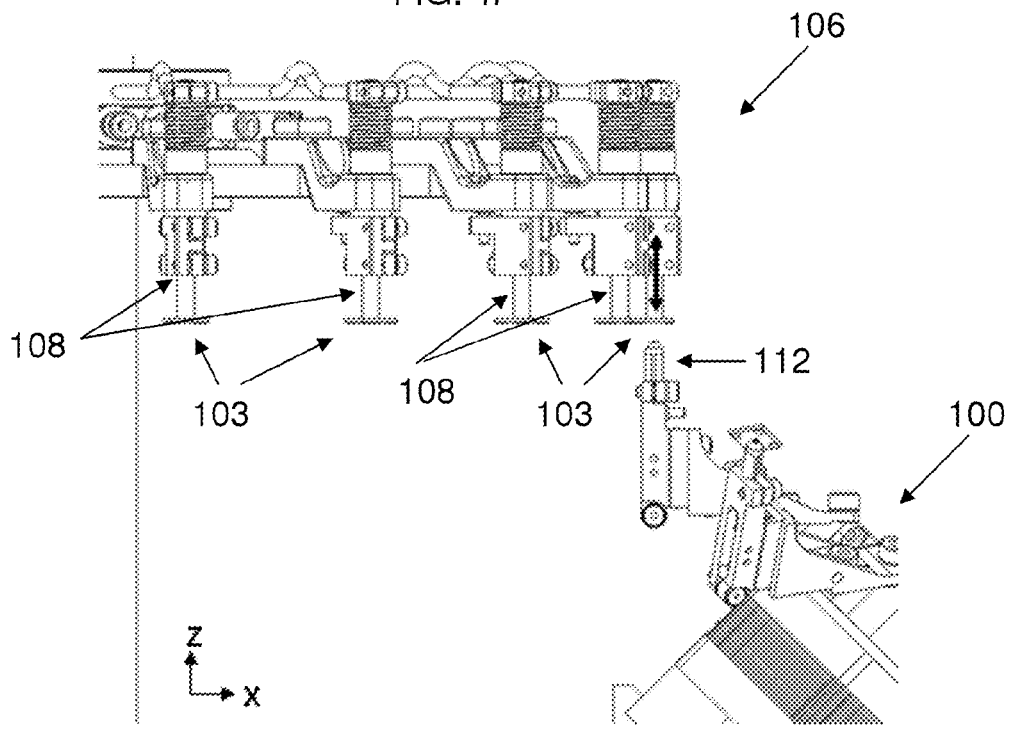

Similarly, the rotary turret 106 is indexed so that successive turret pick heads 108 of the rotary turret 106 can pick up respective other IC packages 103 from the transfer apparatus's pick heads 112, as shown in FIG. 4g for subsequent downstream processes (eg testing, sorting, and/or packing) by one or more processing modules for processing the IC packages 103.

Various embodiments can also be envisaged within the scope of the invention as claimed. For instance, the pick heads 112 of the transfer apparatus 100 may be inclined at other angles other than 45 degrees with respect to the transfer apparatus axis 111. Furthermore, the transfer apparatus may also be used for transferring any objects other than the IC packages 103. The transfer pick heads 112 may also be inclined at other angles with respect to the transfer apparatus axis 111 of the transfer apparatus 100 besides the angle of 45 degrees.

The invention claimed is:

1. A transfer apparatus for transferring electronic devices from a wafer to a test handler, the transfer apparatus comprising:
   a rotary device rotatable about an axis;
   a plurality of holders configured to hold the electronic devices for transfer from the wafer to the test handler, the plurality of holders being coupled to and extendable from the rotary device to pick the electronic devices from the wafer; and
   a plurality of biasing devices, each biasing device being configured and operative to bias respective ones of the holders towards a retracted position;
   wherein the plurality of holders are arranged circumferentially around the rotary device, and inclined with respect to the axis of the rotary device, so as to change an orientation of the electronic devices on the wafer to a desired orientation of the electronic devices on the test handler.

2. The transfer apparatus of claim 1, wherein the plurality of holders are inclined at an angle of 45 degrees with respect to the axis of the rotary device, so that the electronic devices are rotated by an angle of 90 degrees after being transferred from the wafer to the test handler.

3. The transfer apparatus of claim 1, further comprising a device pusher for extending each of the holders from the retracted position to an extended position to pick the electronic devices from the wafer.

4. The transfer apparatus of claim 3, further comprising a motor coupled to the device pusher, the motor being operative to drive the device pusher.

5. The transfer apparatus of claim 1, further comprising a detection device for detecting a position of one or more of the electronic devices arranged on the wafer before the said one or more of the electronic devices are picked by the respective holder or holders.

6. The transfer apparatus of claim 5, wherein the detection device comprises:
   an image-capturing device;
   an image-reflecting device arranged relative to the image-capturing device, the image-reflecting device being operative to reflect an image of the said one or more of the electronic devices arranged on the wafer to the image-capturing device.

7. The transfer apparatus of claim 6, wherein the image-capturing device is a camera and the image-reflecting device is a mirror.

8. A system for handling electronic devices, comprising:
   a wafer table for placing a wafer comprising electronic devices;
   a test handler for transferring electronic devices to one or more processing modules for processing the electronic devices; and
   a transfer apparatus for transferring the electronic devices from the wafer to the test handler, the transfer apparatus comprising:
   a rotary device rotatable about an axis; and
   a plurality of holders configured to hold the electronic devices for transfer from the wafer to the test handler, the plurality of holders being coupled to and extendable from the rotary device to pick the electronic devices from the wafer;

wherein the plurality of holders are arranged circumferentially around the rotary device, and inclined with respect to the axis of the rotary device, so as to change an orientation of the electronic devices on the wafer to a desired orientation of the electronic devices on the test handler.

9. The system of claim 8, wherein the plurality of holders are inclined at an angle of 45 degrees with respect to the axis of the rotary device, so that the electronic devices are rotated by an angle of 90 degrees after being transferred from the wafer to the test handler.

10. The system of claim 8, wherein the transfer apparatus further comprises a plurality of biasing devices, each biasing device being configured and operative to bias respective ones of the holders towards a retracted position.

11. The system of claim 10, wherein the transfer apparatus further comprises a device pusher for extending each of the holders from the retracted position to an extended position to pick the electronic devices from the wafer.

12. The system of claim 11, wherein the transfer apparatus further comprises a motor coupled to the device pusher, the motor being operative to drive the device pusher.

13. The system of claim 8, wherein the transfer apparatus further comprises a detection device for detecting a position of one or more of the electronic devices arranged on the wafer before the said one or more of the electronic devices are picked by the respective holder or holders.

14. The system of claim 13, wherein the detection device comprises:
    an image-capturing device;
    an image-reflecting device arranged relative to the image-capturing device, the image-reflecting device being operative to reflect an image of the said one or more of the electronic devices arranged on the wafer to the image-capturing device.

15. The system of claim 14, wherein the image-capturing device is a camera and the image-reflecting device is a mirror.

* * * * *